US006267075B1

United States Patent
Moffat et al.

(10) Patent No.: US 6,267,075 B1
(45) Date of Patent: Jul. 31, 2001

(54) APPARATUS FOR CLEANING ITEMS USING GAS PLASMA

(75) Inventors: William A. Moffat; Royston James Reynolds, both of San Jose, CA (US)

(73) Assignee: Yield Engineering Systems, Inc., San Jose, CA (US)

( * ) Notice: Subject to any disclaimer, the term of this patent is extended or adjusted under 35 U.S.C. 154(b) by 0 days.

(21) Appl. No.: 09/350,322

(22) Filed: Jul. 9, 1999

Related U.S. Application Data (60) Provisional application No. 60/092,318, filed on Jul. 9, 1998.

(51) Int. Cl.[7] ............................................. C23C 16/509
(52) U.S. Cl. ..................... 118/723 E; 156/345; 118/723; 118/500; 118/719; 118/728; 422/22; 204/298.37
(58) Field of Search .................... 118/500, 719, 118/728; 156/345

(56) References Cited

U.S. PATENT DOCUMENTS

| | | | | |
|---|---|---|---|---|
| 4,615,298 | * | 10/1986 | Yamazaki ........................... 118/723 |
| 5,383,984 | * | 1/1995 | Shimada et al. ..................... 156/345 |
| 5,795,452 | * | 8/1998 | Kinoshita et al. ............... 204/298.37 |
| 5,897,831 | * | 4/1999 | Jacob et al. ............................ 422/22 |

FOREIGN PATENT DOCUMENTS

| | | | | |
|---|---|---|---|---|
| 59-167013 | * | 9/1984 | (JP) ............................. H01L/21/205 |
| 60-224216 | * | 11/1985 | (JP) ............................. H01L/21/205 |
| 2-50419 | * | 2/1990 | (JP) ............................. H01L/21/205 |
| 4-25017 | * | 1/1992 | (JP) ............................. H01L/21/205 |
| 6-20975 | * | 1/1994 | (JP) ............................. H01L/21/305 |
| 9-312284 | * | 12/1997 | (JP) ............................. H01L/21/3065 |

OTHER PUBLICATIONS

GLEN 1000P Series Plasma Cleaning System, Glen Technologies, Fremont, California, Section 2.0 (System Set–Up), pp. 1–6 (circa 1990).

* cited by examiner

*Primary Examiner*—Gregory Mills
*Assistant Examiner*—Rudy Zervigon
(74) *Attorney, Agent, or Firm*—Donald J. Pagel (57) ABSTRACT

A plasma cleaning apparatus for cleaning lead frames or other items comprised of a chamber adapted for containing a plasma, a magazine positioned in the chamber for holding the lead frames, a first active electrode positioned in the chamber on one side of the magazine and a second active electrode positioned in the chamber on the other side of the magazine. A first grounded electrode is positioned between the first active electrode and the magazine and a second grounded electrode is positioned between the second active electrode and the magazine. The magazine is held at the same voltage as the first and second active electrodes and a plasma is generated which extends from the first active electrode to the second active electrode.

11 Claims, 6 Drawing Sheets

APPARATUS FOR CLEANING ITEMS USING GAS PLASMA

This application claims priority of provisional application 60/092,318, filed Jul. 9, 1998.

TECHNICAL FIELD

This invention relates to an apparatus and method for cleaning a substrate using a gas plasma, and more specifically to an apparatus and method in which at least two electrodes are positioned on two sides of a magazine that holds the substrate to be cleaned.

BACKGROUND ART

Many different methods and apparatus exist for coupling integrated circuits to lead frames. Typically the integrated circuit is coupled centrally within the lead frame to form an integrated circuit/lead frame assembly using an adhesive, such as epoxy. The integrated circuit is then electrically coupled to the lead frame assembly. The electrical connection between the integrated circuit and the lead frame are usually thin gold wire soldered at one end to the integrated circuit and at the other end to the lead frame. The central portion of the lead frame assembly is then encapsulated in a plastic or ceramic material so that only the lead pins or terminals of the lead frame extend from the encapsulating material.

It is very important that the adhesive bond between the integrated circuit and the lead frame be sufficiently strong to prevent any shifting of the components during operations performed on the lead frame assembly. It is also important that the gold wires coupled between the integrated circuit and the lead frame be both strong and electrically conductive. Therefore, it is important that the surface of the lead frame to which the integrated circuit and electrical connections attach be very clean prior to the application of adhesive or soldering of gold wire, in order to assure the proper connections. It may also be desirable to clean the lead frame assembly prior to encapsulation of the integrated circuit, because contamination on the lead frame assembly prior to encapsulation may result in inferior or non-functioning products.

Lead frames are typically stamped metal strips and are typically handled by automated machinery in magazines that hold stacks of lead frames, often 25 or 40 in number.

Various prior art apparatus and methods exist for use in cleaning the surfaces of the lead frames, including the use of gas plasmas such as argon plasma. It is known in the art to use removable magazines having perforated sides to hold the lead frames during cleaning. The perforations in the sides of the magazines allow the plasma to enter the magazine to remove unwanted material, such as oxides, from the lead frame surfaces. Typically, the lead frames are loaded into the magazine outside of the cleaning apparatus. Then, at a later stage, the magazine is moved into the cleaning apparatus before the plasma cleaning process is initiated.

A number of problems have been encountered in such prior art apparatus and methods using plasma for cleaning lead frames. For example, the perforated sides of the lead frame magazines allow contaminants to enter the magazine and deposit on the lead frames or lead frame assemblies during handling. Additionally, during both automated and manual handling of the magazines unwanted materials are deposited on the exterior of the magazine itself. Unwanted material on the exterior of the magazine may cause several potential problems when the magazine is placed in the plasma chamber for cleaning. First, some of the material removed from the magazines may redeposit onto the lead frames. And second, some of the material removed during cleaning operations deposits on the walls and other surfaces of the plasma chamber. Materials deposited on the interior surfaces of the plasma chamber require periodic cleaning. Such materials build up more quickly, and thus require more frequent cleaning, when deposited materials originate from both the exterior surface of the magazine and from the lead frames, rather than just form the lead frames alone.

Prior art plasma cleaning apparatus pass the plasma across the surface of the lead frames in a single direction. Plasma is very short lived. Therefore, the edge of the lead frame nearest the source of the plasma is cleaned significantly better than the edge of the surface furthest from the plasma source. The wider the lead frame, the more significant this problem becomes.

Accordingly, what is needed is an improved apparatus and method for cleaning the surface of lead frames that overcomes the disadvantages of the prior art.

SUMMARY OF THE PRESENT INVENTION

Accordingly, the present invention is an apparatus and method for generating a gas plasma within a chamber and using the plasma to clean a selected surface or surfaces placed within the chamber. More specifically, the invention is an apparatus and method for cleaning lead frames and integrated-circuit/lead-frame assemblies (hereafter referred to as "lead frame assemblies") using gas plasma. Although the apparatus and method of the invention described below will focus on the use of argon plasma to clean lead frames, in alternate embodiments, any desirable ionizable gas may be used, such as $SF_6$, $CF_4$, $NH_3$, $O_2$, and $H_2$. Additionally, other items or substrates may be cleaned, including items loaded in boats (magazines) and substrate/PCB products.

The device of the invention is an argon plasma cleaning system including a chamber, preferably a vacuum chamber, with a captured or stationary cassette or magazine positioned therein for holding a stack of lead frames or integrated circuit/lead frame assemblies. The stationary magazine includes perforated sides and is preferably open to the front and back.

At least one, and preferably two, electrodes are positioned on each side of the stationary magazine. In a preferred embodiment using four electrodes, two electrodes are positioned on each side. A first inner electrode is positioned a selected distance from a first side of the magazine, and a second inner electrode is positioned a selected distance from the other side of the magazine. Similarly, a first outer electrode is positioned a selected distance from the first inner electrode, on the side of the inner electrode opposite the stationary magazine, and the second outer electrode is similarly positioned a selected distance form the second inner electrode. In a preferred embodiment, the electrodes are perforated sheets or grids lying in a plane parallel to the nearest side of the stationary magazine. Thus, gaps are formed between each pair of inner and outer electrodes and between each inner electrode and the closest side of the stationary magazine. In a preferred embodiment, the device of the invention includes a means for controlling, and changing as desired, the charge and voltage of each electrode and of the stationary magazine.

The apparatus of the invention includes a means for creating a vacuum in the vacuum chamber, such as a vacuum pump assembly that includes a vacuum pump, valve, and pressure gauge, coupled to an exhaust conduit. The apparatus of the invention also includes a means for allowing a chosen ionizable gas into the vacuum chamber, such as a gas inlet assembly that includes preferably, a pressurized gas cylinder, pressure gauge and valve, coupled to an inlet conduit connected to the vacuum chamber. The ionizable gas used is preferably argon, although other ionizable gasses or mixtures of gasses may be used. In a preferred embodiment, two vacuum outlets and two gas inlets are used, one on each side of the vacuum chamber.

During operation, the plasma gas moves from one side of the vacuum chamber to the other side due to the vacuum generated on the side of the vacuum chamber opposite the side from which the ionizable gas flows into the chamber. A control means is used to give each electrode and the stationary magazine a selected charge and voltage. In the preferred embodiment wherein two electrodes are used on each side of the stationary magazine, when the argon passes between the first outer and first inner electrodes, a voltage potential between the electrodes induces the ionizable gas to ionize, creating a plasma. The plasma gas diffuses through perforations in the stationary magazine and across the lead frames removing unwanted material and carrying the material towards the vacuum pump assembly. In one preferred electrode charge-voltage configuration, the electrons in the plasma go to ground, allowing only the positive ions in the plasma to interact with the lead frames.

In another embodiment, the direction of treatment with plasma may be repeatedly switched, by closing the ionizable gas assembly on one side, and activating the vacuum pump assembly on the same side, while simultaneously, the vacuum pump assembly on the opposite side is stopped, and the ionizable gas assembly on that side is started. The plasma is then generated between the second outer electrode and the second inner electrode.

The steps of the method of the invention for cleaning lead frames include: (a) providing a vacuum chamber with a stationary magazine having perforated sides, (b) providing at least one electrode on each side of the stationary magazine, (c) transporting a second magazine (a "transport" magazine) containing a stack of lead frames proximate the stationary magazine, (d) transferring the lead frames from the transport magazine into the stationary magazine, (e) sealing the vacuum chamber and evacuating the atmosphere from the vacuum chamber until a desired vacuum is achieved, (f) admitting an ionizable gas into the vacuum chamber, (g) inducing the ionizable gas to ionize, (h) exposing the lead frames to the ionized gas to remove surface contaminants and or to otherwise treat the surface of the lead frames, and (i) restoring atmospheric conditions to the vacuum chamber. After the cleaning process is finished, the clean lead frames are moved from the cleaning chamber using the same or another transport magazine for further transportation and processing.

In other embodiments, step (a) may further include the sub-step of electrically coupling the stationary magazine to act as an electrode. Step (g) may further include the sub-step of selecting a charge and voltage for each electrode, and for to the stationary magazine, thereby establishing an electric field potential between the electrodes, and/or magazine, sufficient to induce the formation of ionizable gas plasma. Step (h) may further include the sub-step of causing the ionizable gas to pass across the surface of the lead frames to be treated in a first direction, in which case, the method may further include the additional sub-step of reversing the direction of flow of ionizable gas in a second opposite direction after a selected period of time.

DETAILED DESCRIPTION OF THE PREFERRED EMBODIMENT

Accordingly, the invention is an improvement over the prior art apparatus and methods for cleaning lead frames, using argon plasma, both prior to the attachment of integrated circuits to the lead frames, and after the integrated circuits have been coupled to the lead frames to form a lead frame assembly.

Figure 1:
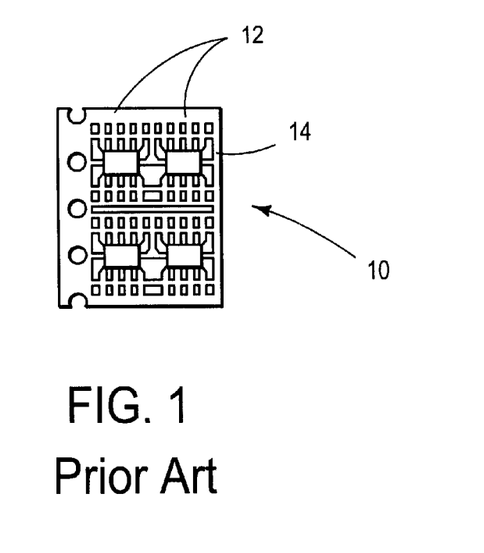
FIG. 1 is a top view of a typical prior art lead frame.
Figure 2:
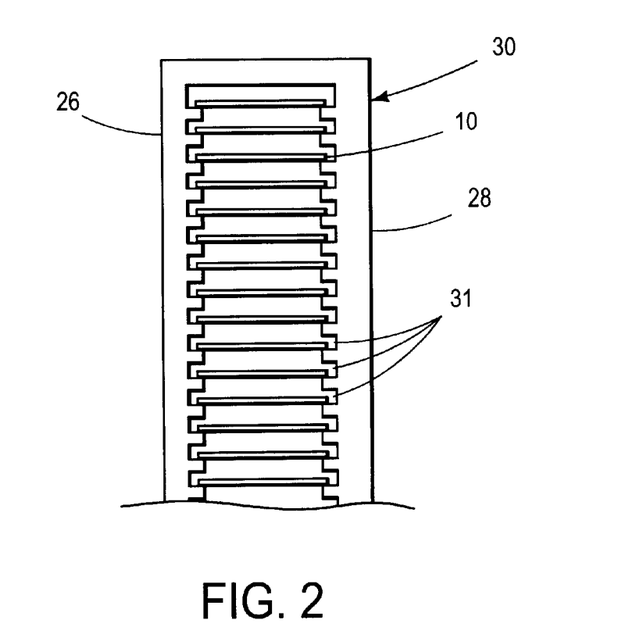
FIG. 2 is a front view of a portion of a magazine holding a stack of the lead frames of FIG. 1.

FIG. 1 shows a typically prior art lead frame strip (hereafter "lead frame 10") comprising two rows 12 of lead frame elements 14. FIG. 2 shows a front view of a portion of the stationary magazine 30 holding a stack of lead frames 10. The lead frames 10 are frequently made of a nickel iron alloy, but other materials or alloys may be used. The magazine is preferably made of aluminum and is preferably open at the front and back allowing the lead frames to be slid in and out of either the front or back of the stationary magazine 30 as necessary. The sides 26 and 28 of the stationary magazine 30 include perforations 42 (shown in FIG. 4). A plurality of slots 31 are formed along inside surfaces of the sides 26 and 28 to provide ledges on which the lead frames 10 can rest.

An advantage to using the stationary magazine 30 within the vacuum chamber 18, rather than placing the transporting magazine within the vacuum chamber 18, is that contamination of the vacuum chamber 18 is reduced by allowing only the lead frames 10, intended to be cleaned, into the vacuum chamber 18. For similar reasons, it is preferable that movable parts of the invention be located outside of the vacuum chamber 18 to reduce particle contamination within the vacuum chamber 18.

Figure 3:
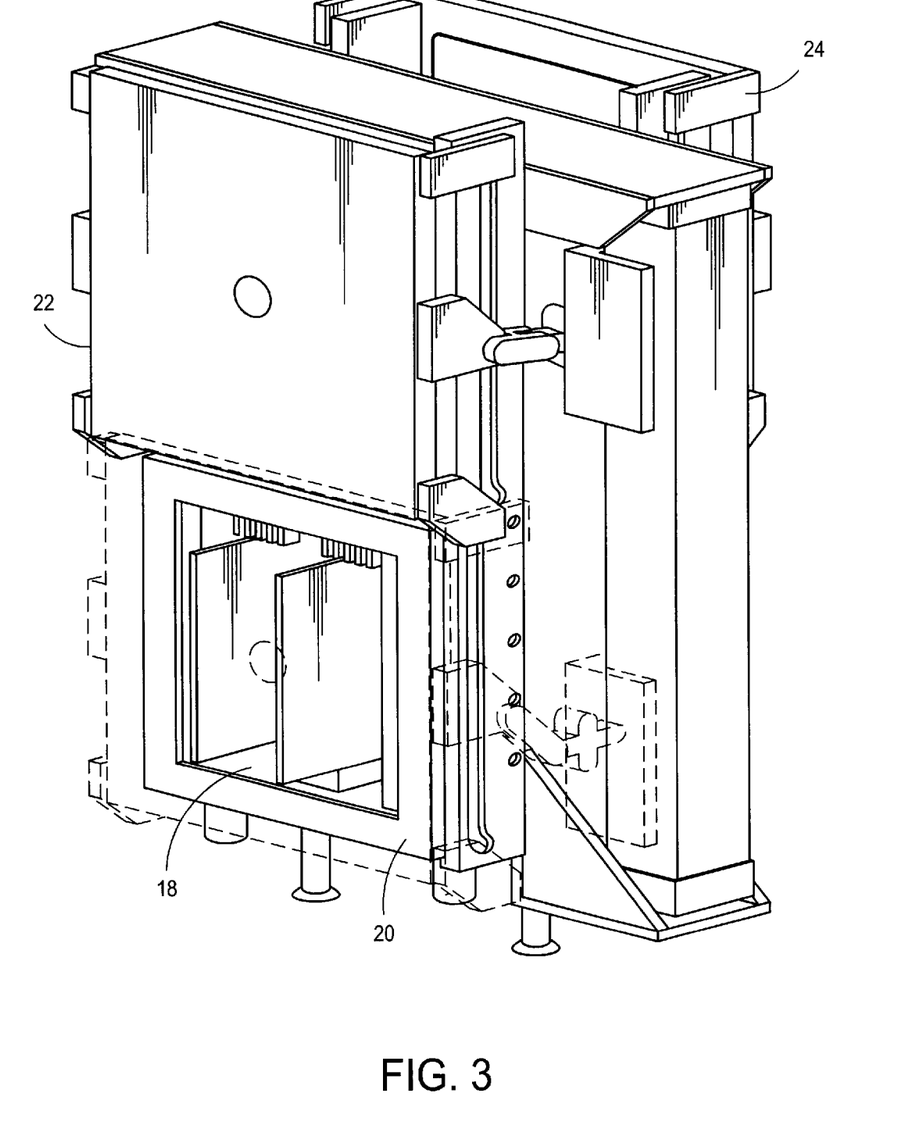
FIG. 3 is a perspective view of the plasma cleaning assembly of the present invention.

FIG. 3 is a perspective view of the plasma system of the invention. The system includes the vacuum chamber 18 within a housing 20. Two doors 22 and 24 are movable coupled to the housing 20. The doors are preferably pneumatic, automatically controlled, and include a means for sealing against the housing 20 when closed so that a vacuum may be maintained in the vacuum chamber 18 during operation. The means for sealing the vacuum chamber 18 preferably includes one or more silicone gaskets either on the doors 22 and 24, or on the housing 20, or both. Although only two electrodes are shown in FIG. 3, four electrodes are preferred; two on each side of the stationary magazine 30 as is shown in FIG. 4.

Figure 4:
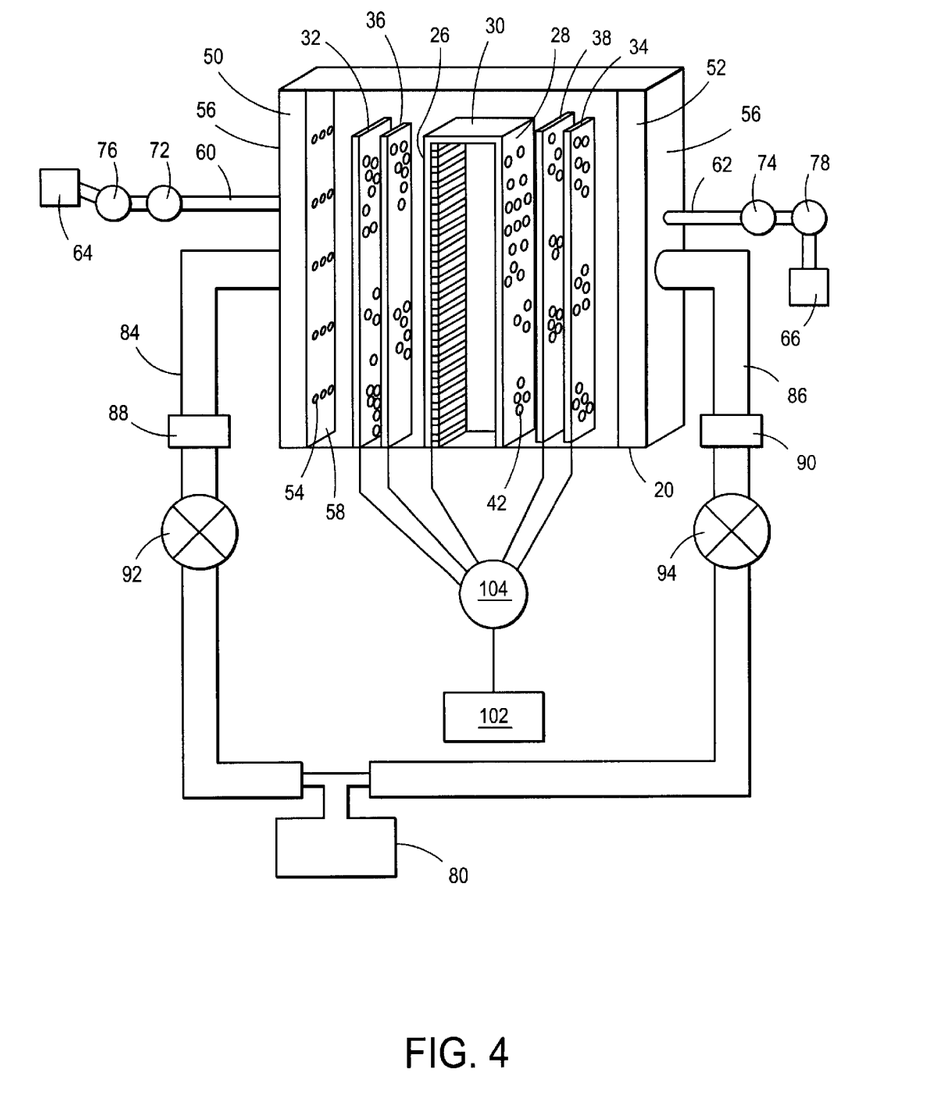
FIG. 4 is a schematic view of the vacuum chamber of the present invention and various conduits and electrical connections coupled thereto.

FIG. 4 is a schematic view of the vacuum chamber 18 showing two electrodes on each side of the stationary magazine 30, and the various connections to the vacuum chamber 18. The stationary magazine 30 is secured in the chamber 18 by fastening means, such as bolts. The stationary magazine 30 is meant to remain inside the chamber 18 so that it does not pick up contaminants from outside the chamber 18.

The electrodes shown in FIG. 4 are identified as the first outer electrode 32, the second outer electrode 34, the first inner electrode 36 and the second inner electrode 38. The electrodes 32–38 may be flat screens, mesh, or perforated sheets of metal with a surface area approximately equal to the surface area of a side of the stationary magazine 30. In the preferred embodiment, seen in FIG. 4, the electrodes 32–38 comprise flat, rectangular perforated metal sheets approximately ⅛ inch gauge, with the perforations (holes) 40 being circular and approximately ¼ inch in diameter, although other shapes and sizes are usable. In one embodiment, the ratio between the solid portion of the surface area of the electrodes and the perforations 40 is approximately 40% open space to 60% solid electrode. However, other ratios between electrode material and open space may be used. The perforations (holes) 40 allow the gas and/or plasma to pass through the electrodes.

The electrodes 32–38 are preferably formed of aluminum, as is the housing 20 itself, but other metals or alloys may be usable. The electrodes 32–38 are preferably electrically isolated from the interior walls of the vacuum chamber 18, and from the stationary magazine 30, by any nonconductive material that is also resistant to the vacuum chamber 18 environment during operation, such as PEEK® (polyethylethylketone). The spacing between adjacent electrodes 32 and 36, and between electrodes 34 and 38 is preferably adjustable in a range between ¼ inch and ¾ inch, but more preferably set at approximately ½ inch. Similarly, the spacing between the inner electrodes 36 and 38 and the stationary magazine 30 is preferably adjustable in a range between ¼ inch and ¾ inch, but more preferably set at approximately ½ inch.

Each side of the vacuum chamber 18 preferably includes a plenum 50 and 52. Each plenum 50 or 52 is a chamber including a first wall 56 and a second perforated wall 58. The first wall 56 is coupled to an inlet conduit 60 and to an exhaust conduit 84. The second wall 58 is open to the chamber through a series of perforations. The purpose of the plenum 50 and 52 is to provide an area for expansion and diffusion of the argon gas so that the gas will leave the plenum 50 or 52 relatively evenly distributed across the area of the plenum 50, 52, and thus across the surface area of the nearest electrode in a somewhat laminar flow. Thus, the perforations 54 on the second perforated wall 58 of each plenum can be any desired shape, size and number. However, it is preferable that the configuration of the perforations on the second wall 58 of each plenum 52 and 54 be chosen to provide a flow of gas into the chamber that approaches a laminar flow.

The first inlet conduit 60 is coupled at one end to the first plenum 50, and at the other end to a gas reservoir 64 to form a first inlet conduit assembly. A second inlet conduit 62 is coupled at one end to the second plenum 52, and at the other end to a gas reservoir 66 to form a second inlet conduit assembly. The inlet conduits 60, 62 are used to deliver the gas, preferably argon into the vacuum chamber 18.

A known gas valve 72, 74 and known gauge 76, 78 is interposed in each inlet conduit 60, 62 and is used to control the amount of gas admitted to the vacuum chamber 18. The gauge may be any usable type of gauge, such as a GRANVILLE PHILLIPS® gauge made by Granville Phillips Corporations, or the like. Any practical valve may be used, such as an ASCO® valve, made by Automatic Switch Company. However, the valve and gauge chosen will preferably be capable of measuring relatively low pressures. The inlet conduits 60 and 62 may have any interior diameter, but approximately ¼ inch interior diameter is considered sufficient.

During operation, controlled amounts of atmosphere may be removed from the vacuum chamber 18 to produce any desired degree of vacuum in the vacuum chamber 18. A first vacuum pump assembly comprises a first exhaust conduit 84, a first gauge 88, and a first valve 92, while a second vacuum pump assembly comprises a second exhaust conduit 86, a second gauge 90, and a second valve 94. If desired, a gas flow meter may also be coupled to the exhaust conduit. Any practical gauge or valve may be used for valves 92, 94 and gauges 88, 90, such as those previously identified. A vacuum pump 80 is connected to the exhaust conduits 84 and 86, with the valves 92 and 94 being positioned between the pump 80 and the exhaust conduits 84 and 86. Any vacuum pump capable of achieving a vacuum of about $10^{-3}$ Torr (one milliTorr) may be used as the vacuum pump 80. The exhaust conduits 84 and 86 may have any interior diameter, but approximately 1.5 inches interior diameter is considered sufficient.

During operation, the vacuum created by the vacuum pump assemblies will preferably range between 100 and 200 milliTorr depending on a number of factors, including the air tightness of the chamber 18. Preferably, the pump 80 will maintain the chamber 18 at a pressure of approximately 160 milliTorr when no gas is being introduced into the chamber 18 by the conduits 60 or 62. During a cleaning cycle, gas (e.g. argon) is flowing continuously into the chamber 18 through one of the plenums 50 or 52. If gas is entering the chamber 18 through the plenum 50 (via conduit 60), then the conduit 62 is closed (i.e. valve 74 is closed). The valve 94 would be open so that the chamber 18 is being evacuated through the plenum 52 (by the pump 80). The flow rate of the gas is adjusted so that a constant pressure (e.g. 1 Torr) is maintained during the cleaning cycle.

While various ionizable gases may be used, particularly inert gases, it is preferable that a totally inert gas be used whenever possible. The preferred gas of the present invention is argon, since it is a heavy gas and provides a relatively large mass of ions compared to other inert gases. It should be noted that the cleaning treatment with argon plasma can be performed at room temperature or below, unlike other gases that may require heating of the substrate prior to treatment. A secondary advantage to using argon, at least partly due to its relatively heavy mass, is that the argon plasma roughens the surface of the lead frames 10. An increase of up to 10 times the effective surface area may be achieved, which allows stronger bonding with the epoxy used to affix the integrated circuit to the lead frame 10.

The power supply 102 preferably produces AC voltage in a range between 100 and 1,000 volts, and more preferably between 300 and 400 volts, although other voltages may be used depending on a number of factors including the size of electrodes. Preferably the AC voltage has a frequency of about 40 Hz.

A number of different configurations of charges are possible on the electrodes 32–38 and on the stationary magazine 30 during a cleaning cycle. The electrodes 32–38 are in electrical communication with the power supply 102 through a control means 104 that allows the charge of the electrodes 32–38 to be switched, so that each electrode may alternately be an active, ground, or neutral, as desired. Two preferred configurations will be explained. In a first configuration seen in FIG. 5, a voltage of approximately 400 volts is applied. The first outer electrode 32 is grounded, the first inner electrode 36 is active, and the stationary magazine 30 is grounded. The second inner electrode 38 and the second outer electrode 34 are neutral in this portion of the cycle, but may be used if it is desired to reverse the direction of argon plasma flow. Specifically, the controller 104 (FIG. 4) is used to switch the electrode configuration so that electrode 34 is grounded, electrode 38 is active and electrodes 32 and 36 are neutral. The stationary magazine 30 remains grounded. Then by reversing the flow of the ionizable gas (as explained below), plasma is generated which enhances the cleaning of items positioned in the right-hand side of the magazine 30. A typical cleaning cycle lasts about five minutes and in some cleaning cycles, it may be desirable to switch the active electrode function between electrodes 36 and 38 (and the corresponding grounds and gas flow direction) approximately every ten seconds. On the other hand, in some cleaning situations, it may not be necessary to switch the active electrode configuration and gas flow direction at all (i.e. a single configuration may work in some cases).

Figure 5:
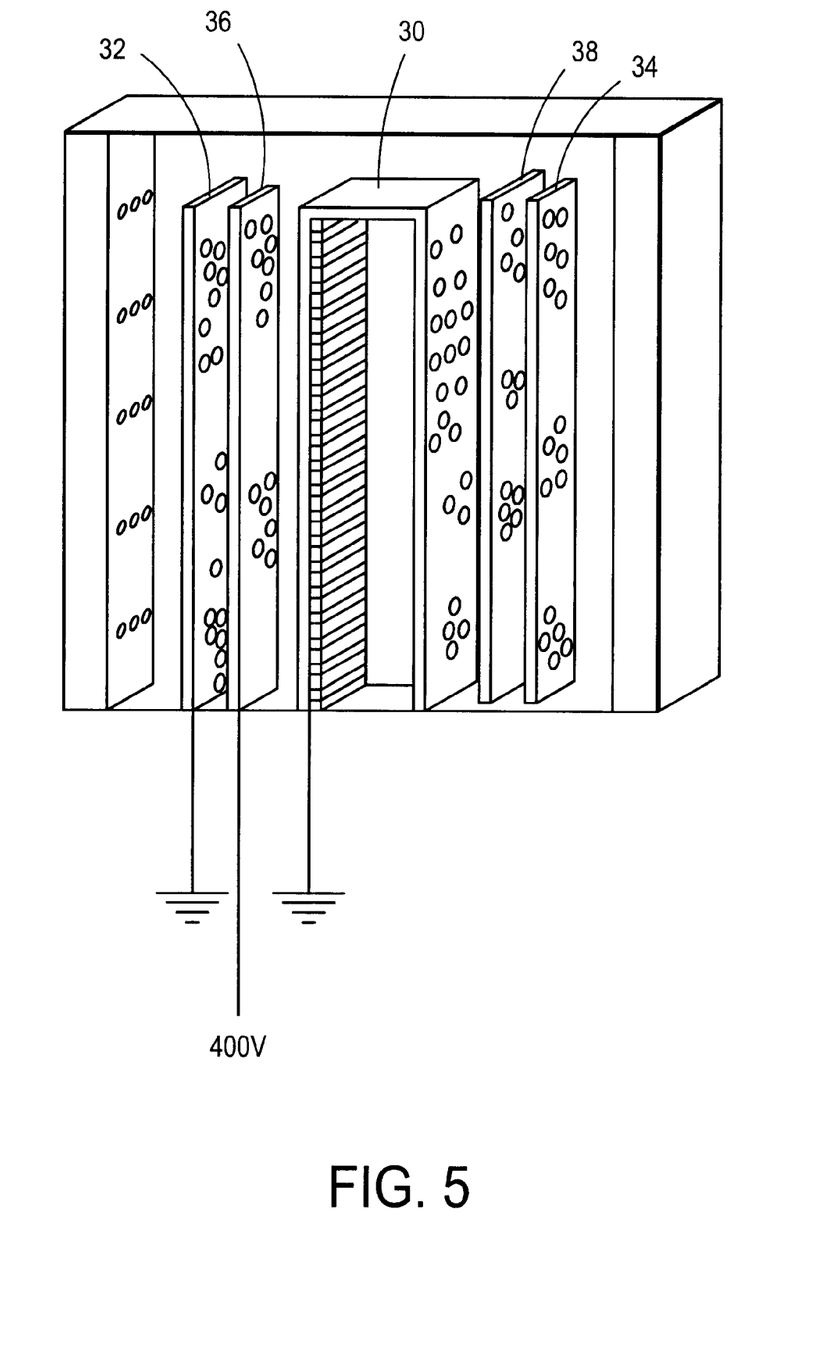
FIG. 5 is a diagram of a first configuration of the invention.

In the configuration set forth above, as the argon passes into the gap between the first outer electrode 32 and the first inner electrode 36, the voltage potential between the first outer electrode 32 and the first inner electrode 36 induces the argon gas to ionize. Some of the argon gas and argon ions pass through the perforations 40 in the first inner electrode 36 into the gap between the first inner electrode 36 and the stationary magazine 30, where ionization may also occur. The plasma gas ions are accelerated towards the stationary magazine 30 and across the surfaces of the lead frames 10 either by volition or by the vacuum generated by the vacuum pump assembly 80 or 82 on the side of the vacuum chamber 18 opposite the side in which the argon gas has entered the vacuum chamber 18. The argon plasma cleans and roughens the surface (surface modification) of the lead frames 10 within the stationary magazine 30. After a selected period of time, normal atmospheric pressure is re-established in the vacuum chamber 18, the vacuum chamber 18 is opened, and the lead frames 10 are transferred from the stationary magazine 30 to a transport magazine, without removing the stationary magazine 30 from the chamber 18.

Figure 6:
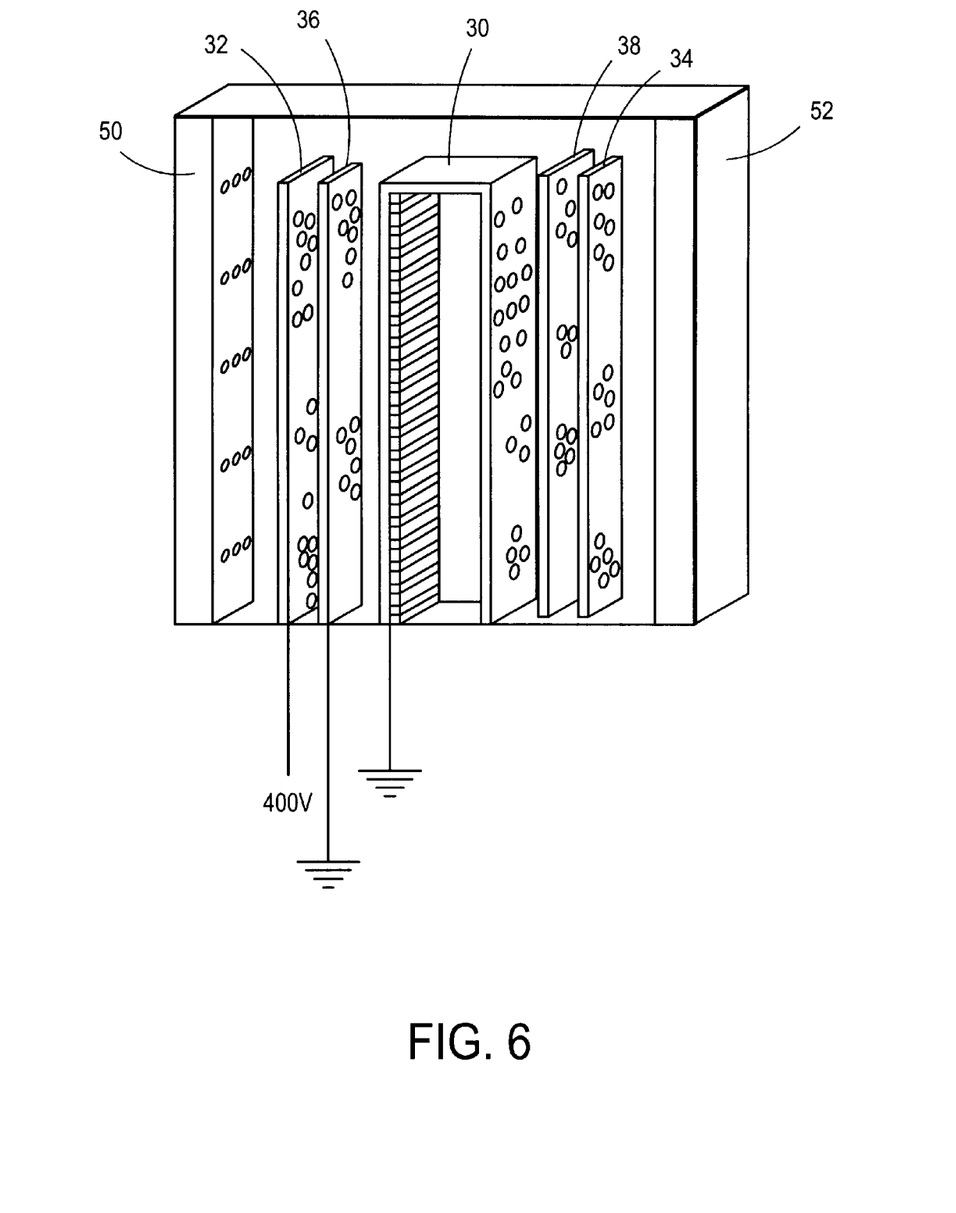
FIG. 6 is a diagram of a second configuration of the invention.

In a second configuration seen in FIG. 6, a voltage of approximately 400 volts is again applied. The first outer electrode 32 is active, the first inner electrode 36 is at ground, and the stationary magazine 30 is also at ground. The second inner electrode 38 and the second outer electrode 34 are neutral, but are used if it is desired to reverse the direction of argon plasma flow. Specifically, if the electrodes are reversed, electrode 34 is active, electrode 38 is ground, electrodes 32 and 36 are neutral and magazine 30 is grounded. It should be appreciated that other configurations of active and ground electrodes are possible, as controlled by the controller 104, including permutations where the magazine 30 is active.

In the FIG. 6 configuration, as plasma gas passes into the gap between the first outer electrode 32 and the first inner electrode, the voltage potential between the first outer electrode 32 and the first inner electrode 36 induces the argon gas to ionize. Some of the argon gas and argon plasma passes through the apertures in the first inner electrode 36 into the gap between the first inner electrode 36 and the stationary magazine 30. The electrons in the plasma, having virtually no mass (and hence no volition) are diverted to ground through the first inner electrode 36, and do not pass through the stationary magazine 30 to interact with the surface of the lead frames 10. The argon ions are accelerated towards the stationary magazine 30 and across the surfaces of the lead frames 10 either by volition or by the vacuum generated by the vacuum pump on the side of the vacuum chamber 18 opposite the side in which the argon gas has entered the vacuum chamber 18.

This second configuration (shown in FIG. 6) is particularly useful for cleaning lead frame assemblies. The integrated circuits in the lead frame assemblies may be damaged by an accumulation of static charge caused by the electrons from the argon plasma. Removal of the electrons from the argon plasma by the grounding of the first inner electrode 36 may prevent such damage. In contrast, the electrode configuration shown in FIG. 5 generates a more vigorous cleaning plasma because it includes free electrons.

In both example configurations set forth above, after a selected period of time, it may be advantageous to reverse the direction of flow of argon plasma. Argon plasma is short lived. Therefore, the edge of the lead frame 10 nearest the source of argon plasma is cleaned significantly better than the edge of the surface furthest from the argon plasma source. The wider the lead frame 10, the more significant this problem becomes. This problem may be alleviated by reversing the direction of plasma flow after a selected period of time. The direction of flow of plasma may be reversed by both (a) reversing the gas flow, and (b) reversing the electrode configuration (as was discussed above with respect to FIGS. 5 and 6 above).

The gas flow is reversed by closing the gas inlet on one side, and opening the vacuum pump valve on the same side, while simultaneously closing, the vacuum pump valve on the opposite side, and opening the gas inlet on that side. The opening and closing of the vacuum pump valves 92 and 94 and the gas inlet valves 72 and 74, and the reversal of the electrode configuration is automatically controlled by the control means 104.

The configuration of the electrodes 32–38 is reversed by deactivating the electrodes on the currently active side, and activating the electrodes on the opposite side of the stationary magazine 30. For example, referring to FIG. 5, the electrodes are reversed by deactivating the first outer electrode 32 and the first inner electrode 36. Then activating the second outer electrode 34 as a ground and the second inner electrode 38 as an active electrode. The stationary magazine 30 remains grounded.

A third configuration (shown in FIG. 7) has proved the most useful in cleaning lead frames and other items. In this configuration, the electrodes 32 and 34 are both active at the same time, while the electrodes 36 and 38 are both grounded. The magazine 30 is electrically active in this configuration, meaning that the magazine 30 is maintained at the same voltage as the electrodes 32 and 34. Typically, the preferred voltage on the electrodes 32 and 34, and on the magazine 30, is in the range of approximately 300 to 400 volts (AC voltage), for example 400 volts. However, other voltages in the range of 100 to 1000 volts can be used. In this configuration, the electrodes 32 and 34 remain active during the entire cleaning cycle with no switching.

Figure 7:
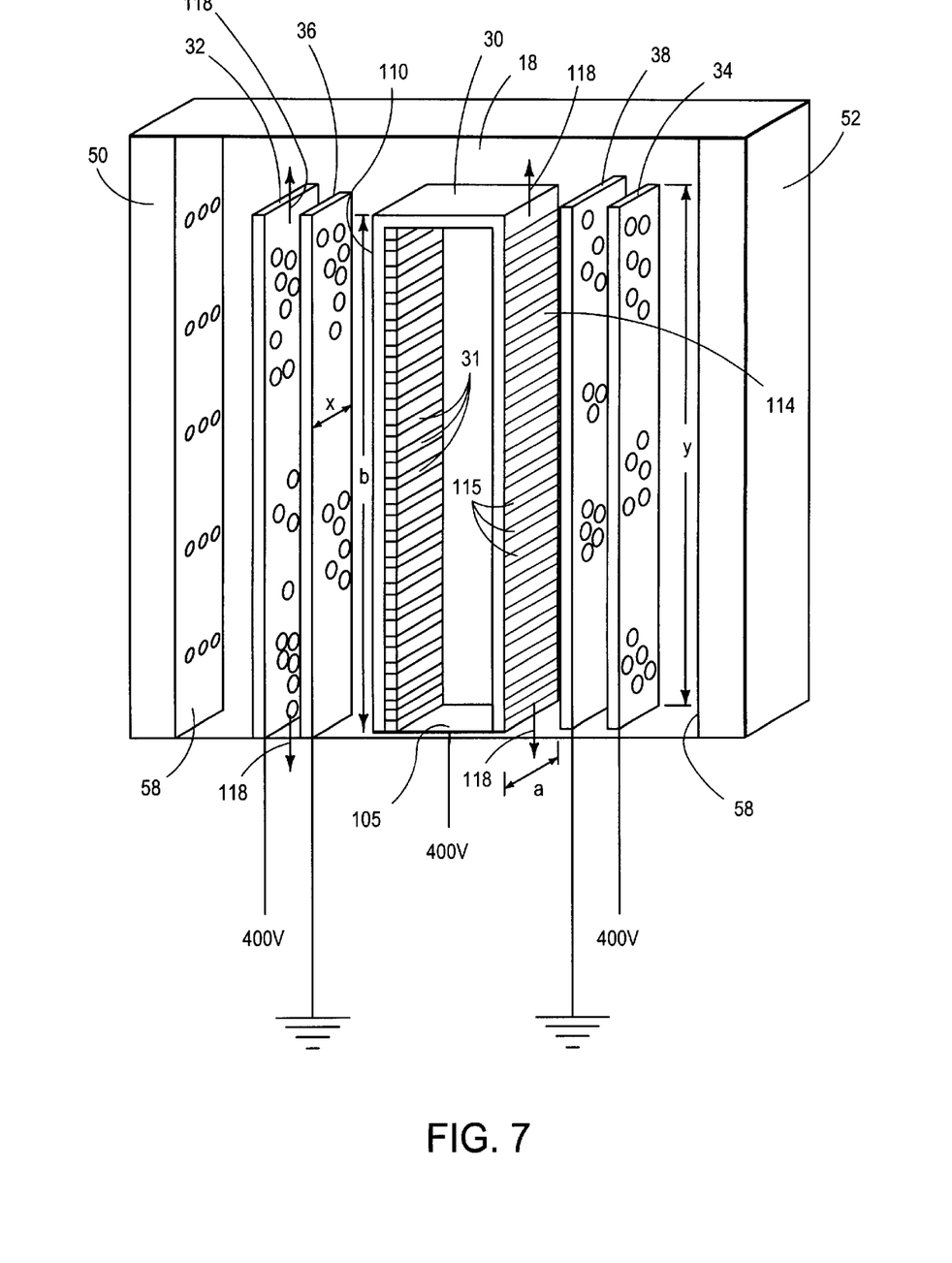
FIG. 7 is a diagram of a third configuration of the invention.

Typically, the magazine 30 rests on a three layer structure comprised of a bottom metal layer (e.g. aluminum), an insulating layer (e.g. PEEK) and a top metal layer (e.g. aluminum). A bottom side 105 of the magazine 30 rests on the top metal layer which is connected to the power supply 102 by electrical leads. Since the entire magazine 30 is constructed of conductive material (e.g. aluminum), the power supply 102 supplies the voltage that holds the whole magazine 30 at the same potential as the active electrodes 32 and 34 (e.g. 400 volts).

In a typical cleaning cycle used with the configuration shown in FIG. 7, gas (preferably argon) is introduced into the chamber 18 through a gas inlet (e.g. plenum 50) generally at a flow rate of about 10 cm$^3$/min. Concurrently, a vacuum is pulled on the chamber 18 through a vacuum outlet (e.g. the plenum 52), thus setting up a constant flow of argon gas across the chamber 18. The flow rate of the gas and the pressure of the vacuum are adjusted so that a pressure of about one Torr is maintained in the chamber 18.

FIG. 7 also illustrates the preferred configuration of the components where the electrodes 32, 34, 36 and 38 are all rectangular in shape. The magazine 30 includes the rectangular shaped sides 110 and 114. A plurality of holes extend entirely through each of the electrodes 32, 34, 36 and 38. A plurality of apertures 115 extend entirely through the sides 110 and 114 so that the plasma can pass through the electrodes and sides 110 and 114. Generally, the apertures 115 are slots positioned near the slots 31 that hold the lead frames. This alignment allows the plasma to flow over the top surface of the lead frames held in the magazine 30, thereby providing effective cleaning.

Each of the electrodes 32, 34, 36 and 38 have approximately the same width x and height y. The sides 110 and 114 have a width a and height b that are slightly smaller than the corresponding electrode dimension (e.g. approximately one inch less). This ensures that the plasma will cover all of the sides 110 and 114, and not cut off at the edges. For reference purposes, each of the electrodes and sides 110 and 114 can be thought of as having a centerline 118 which bisects the component along a vertical axis (In FIG. 7, the centerlines 118 are only illustrated on the electrode 32 and the side 114, but the electrodes 34, 36 and 38 and the side 110 have similar centerlines).

The electrode 32 is positioned outside of the magazine 30 between side 110 and one of the walls 58. The electrode 32 is parallel to the side 110 meaning that the plane of the electrode 32 formed by the width x and height y is parallel to the plane of the side 110 formed by the width x and height y. The electrode 36 is positioned outside of the magazine 30 between the electrode 32 and the side 110 and is parallel to the side 110.

Similarly, the electrode 34 is positioned outside of the magazine 30 between side 114 and the other the wall 58 (i.e. the wall 58 that is not adjacent to the electrode 32). The electrode 34 is parallel to the side 114 meaning that the plane of the electrode 34 formed by the width x and height y is parallel to the plane of the side 114 formed by its width x and height y. The electrode 38 is positioned outside of the magazine 30 between the electrode 34 and the side 114, and is parallel to the side 114. Additionally, the centerlines 118 of the electrodes 32, 34, 36 and 38 and of the sides 110 and 114 are all aligned with each other along a horizontal axis, and each of the electrodes 32, 34, 36 and 38 and of the sides 110 and 114 are parallel to each other. This alignment optimizes the amount of plasma that is available to clean items contained in the magazine 30. It is believed that a plasma is generated which extends from the electrode 32 to the electrode 34, thereby cleaning the entire surface of the lead frames positioned in the magazine 30.

The method of using the apparatus illustrated in FIG. 7 is as follows: the vacuum chamber 18 is provided with the stationary magazine 30 for holding a plurality of lead frames or other items to be cleaned. The lead frames or other items are transferred into the stationary magazine while the stationary magazine is positioned inside of the vacuum chamber. The pressure in the vacuum chamber is reduced using the vacuum pump 80 and gas (e.g. argon) is introduced into the chamber 18. A constant flow of gas and vacuum is established. Finally, a plasma is generated inside of the vacuum chamber 18 using the electrode 32 positioned outside of the magazine 30 and maintained at a first voltage, and the electrode 34 positioned outside of the magazine 30 and maintained at a second voltage, with the magazine 30 being maintained at a third voltage.

Generally, the first, second and third voltages are all the same, and are preferably in the range of 300–400 volts. However, in other embodiments one or more of these voltages could be different. Also, in the preferred method, the electrode 36 is positioned between the electrode 32 and the magazine 30 and is maintained at ground. The electrode 38 is positioned between the electrode 34 and the magazine 30 and is maintained at ground.

The method of using the present invention in some of the alternative embodiments comprises the steps of: (a) providing a vacuum chamber 18 with a stationary magazine 30 having perforated sides, (b) providing at least two electrodes on each side of the stationary magazine 30, (c) transporting a second magazine containing a stack of lead frames 10 proximate the stationary magazine 30, (d) transferring the lead frames 10 from the second magazine into the stationary magazine 30, (e) sealing the vacuum chamber 18 and evacuating the atmosphere from the vacuum chamber 18 until a desired vacuum is achieved, (f) admitting an ionizable gas into the vacuum chamber 18, (g) using a first active electrode and a first ground electrode positioned on a first side of the stationary magazine to induce the ionizable gas to ionize, (h) exposing the lead frames 10 to the ionized gas to remove surface contaminants and or to otherwise treat the surface of the lead frames 10, (i) after a period of time, optionally reversing the direction of gas flow in the chamber and causing the first active electrode and the first ground electrode to become neutral and using a second active electrode and a second ground electrode positioned on a second side of the stationary magazine to induce the ionizable gas to ionize, and re-exposing the lead frames 10 to the ionized gas to remove surface contaminants, (j) restoring the atmosphere to the vacuum chamber 18, and (k) transporting to the lead frames 10 to the same or another second magazine for further transportation and processing.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. A plasma cleaning apparatus comprising:
  a chamber adapted for containing a plasma, the chamber comprising the region between a first wall and a second wall;
  a magazine positioned in the chamber for holding one or more items to be cleaned, the magazine comprising a first side and a second side between which the item or items to be cleaned will be placed, the magazine being adapted to have a first voltage applied to it, the first side and the second side each being rectangular in shape and each having a width "a" and a height "b";
  a first electrode positioned in the chamber adjacent to the first wall, the first electrode being rectangular in shape and having a width "x" which is greater than the width "a" and a height "y" which is greater than the height "b";
  a second electrode positioned in the chamber between the first electrode and the first side of the magazine, the first electrode being adapted to have a second voltage applied to it and the second electrode being adapted to be electrically grounded;

a third electrode positioned in the chamber adjacent to the second wall, the third electrode being rectangular in shape and having the width "x" which is greater than the width "a" and the height "y" which is greater than the height "b";

a fourth electrode positioned in the chamber between the third electrode and the second side of the magazine, the third electrode being adapted to have a third voltage applied to it and the fourth electrode being adapted to be electrically grounded, and with the first voltage, the second voltage and the third voltage all having the same value and being capable of generating a plasma;

a gas inlet for allowing a gas which will be used to generate the plasma to be introduced into the chamber; and a vacuum outlet for allowing a vacuum to be pulled on the chamber.

2. The plasma cleaning apparatus of claim 1 wherein the items to cleaned comprise a plurality of lead frames.

3. The plasma cleaning apparatus of claim 1 wherein second electrode and the fourth electrode are both rectangular in shape and have the same width "x" and the same height "y" as the first electrode and the third electrode.

4. The plasma cleaning apparatus of claim 1 wherein the voltage on the first and third electrodes is an AC voltage in the range of 300 to 400 volts having a frequency of approximately 40 Hz.

5. A plasma cleaning apparatus comprising:

a chamber adapted for containing a plasma, the chamber comprising the region between a first plenum and a second plenum, the first plenum and the second plenum each comprising a first wall and a second wall with a space between the first wall and the second wall and the second wall including a plurality of perforations which extend through the second wall;

a magazine positioned in the chamber for holding one or more items to be cleaned, the magazine comprising a first side that is rectangular in shape and a second side that is rectangular in shape, the first side being oriented parallel to the second side, the magazine being adapted to have a first voltage applied to it, and the first side and the second side each having a width "a" and a height "b";

a first electrode positioned in the chamber outside of the magazine, the first electrode being rectangular in shape and being oriented parallel to the second wall of the first plenum, the first electrode having a width "x" which is greater than the width "a" and a height "y" which is greater than the height "b";

a second electrode positioned in the chamber between the first electrode and the first side of the magazine, the second electrode being rectangular in shape and being oriented parallel to the first side, the first electrode being adapted for having a second voltage applied to it and the second electrode being electrically grounded;

a third electrode positioned in the chamber outside of the magazine, the third electrode being rectangular in shape and being oriented parallel to the second wall of the second plenum, the third electrode having the same width "x" and the height "y" as the first electrode;

a fourth electrode positioned in the chamber between the third electrode and the second side of the magazine, the fourth electrode being rectangular in shape and being oriented parallel to the second side, the third electrode being adapted for having a third voltage applied to it and the fourth electrode being electrically grounded;

a gas inlet for allowing a gas to be introduced into the chamber through the first plenum; and a vacuum outlet for allowing a vacuum to be pulled on the chamber, through the second plenum.

6. The plasma cleaning apparatus of claim 5 wherein the first voltage, the second voltage and the third voltage are approximately equal.

7. The plasma cleaning apparatus of claim 5 wherein the first voltage, the second voltage and the third voltage are all approximately equal and are all AC voltages in the approximate range of 300 to 400 volts with a frequency of approximately 40 Hz.

8. The plasma cleaning apparatus of claim 5 wherein the chamber can hold a vacuum of at least approximately $200 \times 10^{-3}$ Torr.

9. The plasma cleaning apparatus of claim 5 wherein the magazine is secured within the chamber.

10. The plasma cleaning apparatus of claim 5 wherein the items to be cleaned comprise lead frames.

11. The plasma cleaning apparatus of claim 5 further comprising:

a first plurality of holes extending completely through the first electrode;

a second plurality of holes extending completely through the second electrode;

a third plurality of holes extending completely through the third electrode;

a fourth plurality of holes extending completely through the fourth electrode;

a first plurality of slots extending completely through the first side of the magazine; and a second plurality of slots extending completely through the second side of the magazine.

* * * * *